(12) United States Patent
Breier et al.

(10) Patent No.: US 7,481,263 B2
(45) Date of Patent: Jan. 27, 2009

(54) COOLING APPARATUS

(75) Inventors: Anton Breier, Friedberg (DE); Hidetoshi Kamagata, Chofu (JP)

(73) Assignee: Mineba Co., Ltd., Nagano-ken (JP)

( * ) Notice: Subject to any disclaimer, the term of this patent is extended or adjusted under 35 U.S.C. 154(b) by 0 days.

(21) Appl. No.: 10/589,572

(22) PCT Filed: Jan. 4, 2005

(86) PCT No.: PCT/EP2005/000029

§ 371 (c)(1),
(2), (4) Date: May 2, 2007

(87) PCT Pub. No.: WO2005/083784

PCT Pub. Date: Sep. 9, 2005

(65) Prior Publication Data

US 2007/0186561 A1    Aug. 16, 2007

(30) Foreign Application Priority Data

Feb. 27, 2004    (DE) .................. 10 2004 009 500

(51) Int. Cl.
*F28F 7/00* (2006.01)
*F28D 15/00* (2006.01)
*H05K 7/20* (2006.01)

(52) U.S. Cl. ............... 165/80.4; 165/104.21; 165/80.3; 165/104.34

(58) Field of Classification Search ............ 165/185, 165/80.3, 80.2, 80.4, 104.21, 104.33, 86, 165/88; 361/695, 697, 699, 700

See application file for complete search history.

(56) References Cited

U.S. PATENT DOCUMENTS

| 5,508,884 | A | | 4/1996 | Brunet et al. |
| 5,864,466 | A | | 1/1999 | Remsburg |
| 5,878,808 | A | | 3/1999 | Rock et al. |
| 6,021,844 | A | * | 2/2000 | Batchelder ............... 165/80.3 |
| 6,336,499 | B1 | * | 1/2002 | Liu ......................... 165/80.3 |
| 6,408,937 | B1 | * | 6/2002 | Roy ...................... 165/104.33 |
| 6,604,575 | B1 | | 8/2003 | Degtiarenko |
| 6,945,314 | B2 | * | 9/2005 | Farrow et al. ............ 165/80.3 |
| 2002/0185263 | A1 | * | 12/2002 | Wagner et al. ........ 165/104.33 |
| 2003/0209343 | A1 | * | 11/2003 | Bingler .................... 165/80.4 |
| 2004/0016533 | A1 | * | 1/2004 | Wagner .................... 165/80.3 |
| 2004/0114327 | A1 | * | 6/2004 | Sri-Jayantha et al. ...... 361/695 |

FOREIGN PATENT DOCUMENTS

| DE | 2929553 | | 7/1979 |
| DE | 3016895 | | 5/1980 |
| DE | 42 22 950 | A1 | 7/1992 |
| DE | 101 14 998 | A1 | 3/2001 |

OTHER PUBLICATIONS

Written Opinion of the International Searching Authority, English Translation.

* cited by examiner

*Primary Examiner*—Tho v Duong
(74) *Attorney, Agent, or Firm*—Duane Morris LLP

(57) ABSTRACT

The invention relates to a cooling apparatus having a cooling structure that comprises at least one surface area for introducing heat, and a cooling member that is connected to the cooling structure in a heat-conducting manner, wherein the cooling member is moveable so as to generate an air flow by means of the movement of the cooling member, the air flow supporting heat emission from the cooling member to the environment.

8 Claims, 1 Drawing Sheet

COOLING APPARATUS

FIELD OF THE INVENTION

Figure 1:
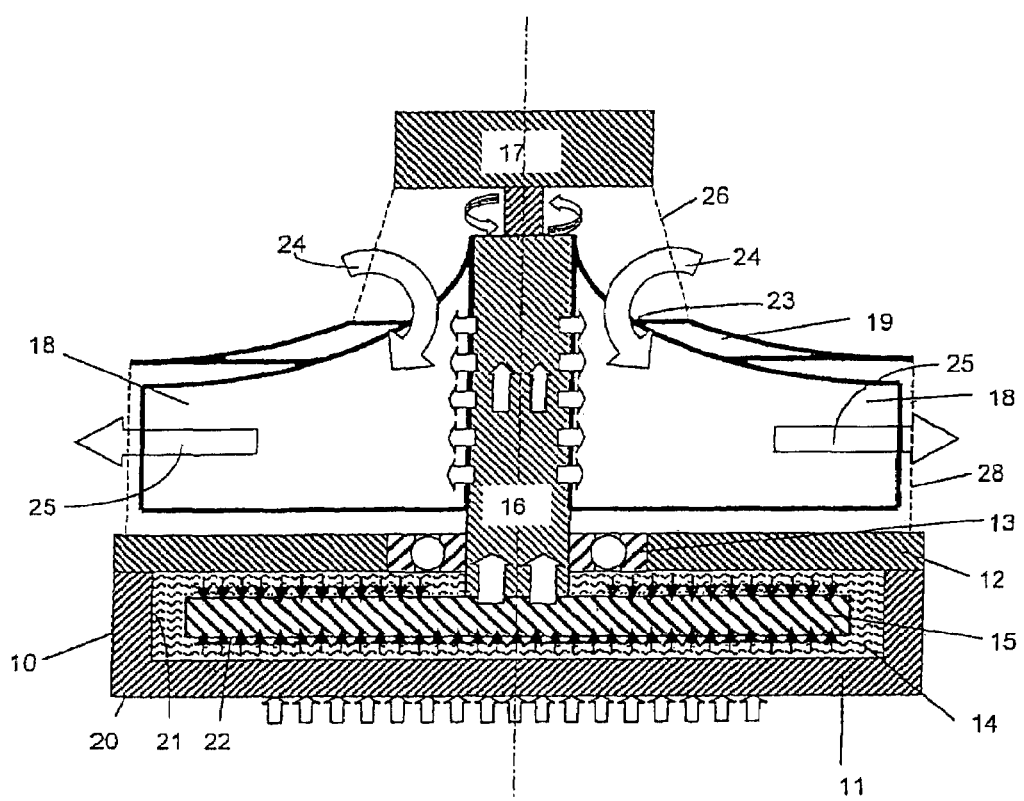

The invention relates to a cooling apparatus comprising a cooling structure that is provided with at least one surface area for introducing heat, and a cooling member which is connected to the cooling structure in a heat-conducting manner.

BACKGROUND OF THE INVENTION

In the prior art, cooling members are used to cool electronic components such as microprocessors or the power IC components of data processing equipment that comprise a plurality of fins so as to provide the largest possible surface area for the heat exchange between the cooling member and the cooling medium, such as air, surrounding the cooling member. To achieve efficient cooling, the thermal resistance between the surface of the components to be cooled, the cooling member and the cooling medium should be minimized. Where only small quantities of heat need be dissipated, a high heat-conducting connection between the components to be cooled and the cooling member is sufficient to provide passive cooling of the components. When larger quantities of heat have to be dissipated, fans are frequently used in the prior art, the fans being mounted close to the cooling member. These fans generate an air flow in the region of the cooling member and consequently improve the heat emission from the cooling body to the environment. Such combinations of cooling members and fans are used, for example, for cooling processors, particularly CPUs in PCs and other electronic data processing (EDP) equipment.

The efficiency of a fan used to locally increase the air flow speed in the region of the cooling member is always subject to restrictions due to the fact that the separation of heat-exchange surfaces and the generation of air flows constantly involves a compromise between air flow and heat conductivity. The emission of heat to the environment requires the largest possible surface area, which, given limited space, can only be realized by using a large number of cooling fins. If the cooling fins are too thin, heat cannot be efficiently conducted into the fins, i.e. a minimum fin thickness, which has to be made to adapt to the overall system, is necessary.

If the outside dimensions of the cooling member are limited, this goes to greatly reduce the free cross-section available for the cooling channels. At the same time, the loss of pressure is significantly increased and the flow rate of the cooling medium is greatly diminished. This results in a substantial rise in the temperature of the cooling medium and thus the temperature of the components to be cooled as well, i.e. the cooling effect declines considerably.

The object of the invention is to provide a cooling apparatus for electronic components such as micro-processors in EDP equipment that can effectively cool these components with a high degree of efficiency.

SUMMARY OF THE INVENTION

The invention provides a cooling apparatus comprising a cooling structure that is provided with at least one surface area for introducing heat, and a cooling member which is connected to the cooling structure in a heat-conducting manner. The invention achieves particularly high heat emission in that the cooling member is designed to be moveable so as to generate an air flow by means of the movement of the cooling member, the air flow supporting heat emission from the cooling member to the environment. In particular, the cooling member is fixedly connected to a shaft, the shaft being rotatably supported in the cooling structure. In a particularly preferred embodiment of the invention, the cooling member has blade-like or vane-like cooling surfaces that project in a radial direction from the shaft. The shaft may be driven, for example, by an electric motor.

The invention is based on the idea that, instead of using the stationary, heat-conducting surfaces of a cooling member to increase heat emission, a cooling member can be used which has moving surfaces like a fan wheel, and more particularly rotating surfaces. The cooling member can be designed in a similar way to a radial fan that has rotating, vane-like blades, or like an axial fan with substantially linear blades. The blades of the cooling member designed in the way of a fan take on the function of cooling fins, wherein it is possible to achieve substantially improved heat transfer from the surface of the cooling member to the cooling medium, particularly air, compared to the prior art. The invention further allows a greater degree of freedom in designing the actual cooling surfaces. The air flows generated by the cooling member can be optimized by the design of the fins or the blades of the cooling member in that, for example, a narrowing of the air flow channels generated by the blades is produced at the radially outer ends of the blades. It is a fundamental fact that the largest air acceleration and the strongest turbulence occurs in the region of the blades, which goes to optimize the transfer of heat.

In order to further improve the efficiency of the cooling apparatus according to the invention, an air guiding device to direct the air flow can be provided. In particular, this device can comprise a cover plate that separates an air suction side and an air release side. In a preferred embodiment of the invention, the cover plate coaxially encloses the shaft and has a central aperture so as to define a flow channel in the vicinity of the shaft. This flow channel ensures that the cooling air is drawn in an axial direction and emitted in a radial direction.

According to a further important aspect of the invention, the entire heat transport path from the heat source, i.e. the components to be cooled, to the cooling medium, such as air, is optimized. To this effect, the cooling structure comprises a container that is filled with a high heat-conducting medium. For its own part, this container is preferably made of a high heat-conducting material, such as copper or aluminum. In order to ensure the highest possible optimization of heat transportation from the surface area for introducing heat to the cooling member, the shaft preferably extends into the container and is fixedly connected to a rotating member within the container. It is then advantageous if the rotating member and the shaft are made of a high heat-conducting material, such as copper or aluminum, and connected to each other in a high heat-conducting manner. The rotating member serves to generate a flow and turbulence in the heat-conducting medium so as to optimize heat transfer from the container wall to the heat-conducting medium held in the container and from there via the rotating member and the shaft to the cooling member. The rotating member can be shaped like a disk. Transition resistance between the individual components is minimized. The rotation of the rotating member in the container goes to generate high heat transfer coefficients between the medium contained in the container and both the inner sides of the container as well as the surfaces of the rotating member. Heat is conducted along the shaft to the cooling member.

In a preferred embodiment of the invention, the shaft is made of a high heat-conducting material having a large cross-section. In another embodiment, the shaft is designed as a heat pipe that can achieve very high axial heat transportation.

According to an aspect of the invention, the shaft is supported in the container by a roller bearing or a sliding bearing that simultaneously serves to seal the container.

The invention is explained in more detail below on the basis of a preferred embodiment with reference to the drawing.

SHORT DESCRIPTION OF DRAWINGS

The one and only FIGURE shows a schematic drawing of a cooling member according to the invention.

DESCRIPTION OF THE PREFERRED EMBODIMENT

The FIGURE shows a cooling structure 10 taking the form of a closed container that comprises a baseplate 11 and a cover 12. A cylindrical cavity is formed in the baseplate 11 that is tightly sealed by the cover 12. Suitable materials for the baseplate 11 and the cover 12 include high heat-conducting materials such as aluminum or copper. A heat-conducting medium 14, particularly a liquid medium, is enclosed in the container 10, the container being fully filled with this medium 14. Apertures (not illustrated) that can be hermetically sealed may be provided in the cover 12 and/or the baseplate 11 for purposes of filling the container 10.

A shaft 16 is rotatably supported in the container cover 12 by means of a roller bearing 13, particularly a ball bearing. Instead of a roller bearing, a sliding bearing, particularly a fluid bearing or a hydrodynamic bearing, can be provided. The shaft 16 extends into the interior of the container 10 and is fixedly connected to a rotating member 15. The rotating member 15 can take the form of a disk with or without openings, or be given any other shape suitable for optimizing the transfer of heat from the medium 14 to the rotating member 15.

At the end opposite to the rotating member 15, the shaft 16 is connected to an electric motor 17 for the purpose of rotating the shaft 16.

External to the container 10, a cooling member 18 is mounted onto the shaft 16, the cooling member 18 being particularly designed in the way of a fan wheel having blade-like or vane-like cooling surfaces that extend radially outwards from the shaft 16. The rotating member 15, the shaft 16 and the cooling member 18 are all made of a high heat-conducting material and are coupled to each other in a heat-conducting manner having the lowest possible thermal resistance, so as to thus optimize the transfer of heat from the outside surface 20 of the cooling structure 10 via the cooling medium 14, the rotating member 15 and the shaft 16 to the cooling member 18. To this effect, the rotating member 15 is coupled to the shaft 16 in a high heat-conducting manner, and the cooling member 18 is also similarly connected to the shaft 16 in a high heat-conducting manner.

As mentioned above, the container 10 is filled with a high heat-conducting medium, particularly a liquid. When the rotating member 15 rotates, currents and turbulences are produced in the liquid 14 so that high heat transfer coefficients occur both on the inside surfaces 21 of the container as well as on the surfaces 22 of the rotating member 15. This goes to further optimize the transfer of heat from the outside surface 20 of the cooling structure 10 via the heat-conducting medium 14 to the rotating member 15.

The heat is conducted in an axial direction along the shaft 16 to the blade-shaped cooling member 18. The shaft 16 can be made of a high conductive material such as copper or aluminum and should have the largest possible cross-section and thus the lowest possible thermal resistance. In a particularly advantageous embodiment of the invention, the shaft 16 can be designed as a heat pipe allowing almost loss-free heat conduction from the cooling structure 10 to the cooling member 18. The thermal resistance of a heat pipe is about one tenth the resistance of copper. A heat pipe is a hollow cylinder which is filled with a liquid that evaporates at an operating temperature. The heat pipe comprises an evaporation region and a condensation region. Heat is absorbed in the (lower) evaporation region, the liquid then enters the evaporating phase and the heat is released once more in the (upper) condensation region, where the liquid again enters the liquid phase. The liquid is then conducted back down to the lower region of the pipe by gravity or using capillary forces. In other words, a heat pipe is a very efficient means of conducting heat between two points with almost no loss at all.

As shown in the FIGURE, the shaft 16 is supported in the cover 12 by means of a bearing 13. The bearing 13 simultaneously acts as a seal, sealing the container towards the outside so as to prevent any medium 14 from escaping.

The rotating member 15, the shaft 16 and the cooling member 18 are rotated by the motor 17. This motor can substantially conform to the fan motors commonly in use in the prior art to cool CPUs.

As mentioned above, the cooling member 18 is designed and constructed in the way of a fan wheel having rotating vanes or blades made of a high heat-conducting material, the fan wheel being coupled to the shaft 16 in a high heat-conducting manner. The cooling member 18 preferably has a rotationally symmetric design that can be optimized to generate a strong, cooling flow of air. The present invention makes it possible to achieve a particularly effective transfer of heat from the surfaces of the cooling member 18 to the surrounding air since the cooling member 18 itself operates like a fan wheel so that the highest air speed occurs in the region of the blades or fins of the cooling member 18. An especially effective transfer of heat is produced by the high air speed and the turbulence generated in the region of the blades. Moreover, compared to the prior art, the invention offers a significantly greater degree of freedom in designing the actual cooling surface of the cooling member 18. Whereas in the prior art, a compromise has to be made between a cooling member having the largest possible surface to emit heat, thick fins and sufficiently large channels for the through flow of air, according to the invention, the blades or the fins of the cooling member 18 can be designed in a variety of ways so as to maximize the surface of the cooling member 18 and simultaneously achieve an optimum air flow.

If the cooling member 18 is designed, for example, in the way of a fan wheel having blades that extend radially outwards, the flow channels for the air are enlarged radially outwards. In order to give added acceleration to the air flow, these channels can be narrowed again in the radially outer region by means of additional fins or by giving the blades a special shape. The design of the moveable cooling member should be aimed at minimizing regions without any air movement that occur in the vicinity of the cooling member and maximizing the flow of air. In conventional technology, where there is a stationary cooling member and a mounted fan, a bell-shaped region is created under the fan motor in which almost no air movement at all occurs and consequently no cooling effect either. Such regions without any air movement are to a large extent eliminated by the present invention. The invention achieves lower overall thermal resistance than is found in the cooling apparatuses for microprocessors usually used in the prior art, which have stationary cooling members and blowers.

According to the invention, a second cover plate 19 can be provided for the improved channeling of air flows and as a protection against contact. This cover plate 19 is disposed coaxially to the shaft 16 and has a central aperture 23. It separates the air suction side from the air release side so as to generate a defined air flow when in operation, indicated in the FIGURE by the arrows 24, 25.

The cooling apparatus according to the invention can be used as a compact unit to cool micro-processors, particularly CPUs, or other processors and heavy-duty components in data processing equipment. Provision can be made for the cooling apparatus to be integrated as a closed unit into a housing that is schematically indicated in the FIGURE by the dotted line 26, 28. In this event, openings have to be provided in the housing 26, 28 in the region of the air flows 24, 25 for the suction and release of cooling air. The cover 19 is then preferably designed such that a current of cooling air flows in an axial direction along the shaft 16 into the cooling apparatus and is diverted in the cooling apparatus so that the air flow is released radially outwards. As mentioned above, this air flow can be optimized by giving the cooling member 18 an appropriate design. The cooling member, or its blades respectively, can particularly be given straight, curved, slotted or perforated surfaces. The height of the surfaces can be made to vary in a radial direction from the inside towards the outside; the sheet metal used for the blades could also have different thicknesses. The housing for the cooling member can take different shapes, such as a cochleate housing as in a radial fan or a square housing as in a fan wheel, in which one or more side faces can be open.

The invention provides a cooling apparatus for an electronic component that optimizes heat transportation from the heat source via the cooling structure 10, the shaft 16 and the cooling member 18 to the environment. In realizing the invention, appropriate heat-conducting materials and liquids can be adopted. It should also be noted that the individual components of the cooling apparatus are coupled to each other with minimum thermal resistance.

The characteristics revealed in the above description, the claims and the FIGURE can be important for the realization of the invention in its various embodiments both individually and in any combination whatsoever.

IDENTIFICATION REFERENCE LIST

10 Container
11 Baseplate
12 Cover
13 Roller bearing
14 Heat-conducting medium
15 Rotating member
16 Shaft
17 Drive unit
18 Cooling member
19 Cover plate
20 Surface area
21 Inner surface
22 Surface
23 Aperture
24 Air flow
25 Air flow
26 Housing
28 Housing

The invention claimed is:

1. A cooling apparatus having a cooling structure comprising:
    at least one surface area for introducing heat, and a cooling member that is connected to the cooling structure in a heat-conducting manner, wherein the cooling member is moveable so as to generate an air flow by means of the movement of the cooling member, the air flow supporting heat emission from the cooling member to the environment, wherein the cooling member is fixedly connected to a shaft and the shaft is rotatably supported in the cooling structure,
    the cooling structure comprises a container that is filled with a high heat-conducting medium,
    the shaft extends into the container and is fixedly connected to a rotating member within the container; and
    an air guiding device to direct the air flow,
    wherein the air guiding device comprises a cover plate that separates an air suction side and an air release side, the cover plate coaxially enclosing the shaft and providing a central aperture to define a flow channel in the vicinity of the shaft.

2. A cooling apparatus according to claim 1, wherein the cooling member has a plurality of blade-like cooling surfaces that project in a radial direction from the shaft.

3. A cooling apparatus according to claim 1, wherein the cooling member has a plurality of vane-like cooling surfaces that project in a radial direction from the shaft.

4. A cooling apparatus according to claim 1, wherein the shaft is connected to an electric drive unit.

5. A cooling apparatus according to claim 1, wherein container is made of a high heat-conducting material, particularly copper or aluminum.

6. A cooling apparatus according to claim 1, wherein the shaft is supported in the container by roller bearings.

7. A cooling apparatus according to according to claim 1, wherein the shaft and the rotating member are made of a high heat-conducting material, particularly copper or aluminum, and are connected to each other in a high heat-conducting manner.

8. A cooling apparatus according to claim 1, wherein the rotating member comprises a disk for generating a flow in the heat-conducting medium.

* * * * *

UNITED STATES PATENT AND TRADEMARK OFFICE
CERTIFICATE OF CORRECTION

PATENT NO.         : 7,481,263 B2
APPLICATION NO. : 10/589572
DATED              : January 27, 2009
INVENTOR(S)       : Anton Breier and Hidetoshi Kamagata It is certified that error appears in the above-identified patent and that said Letters Patent is hereby corrected as shown below:

Cover Page, Assignee: item 73, Change "Mineba Co., Ltd." to --Minebea Co., Ltd.--.

Signed and Sealed this

Twenty-fourth Day of March, 2009

JOHN DOLL
*Acting Director of the United States Patent and Trademark Office*